(12) United States Patent
Cousin

(10) Patent No.: US 7,456,762 B1
(45) Date of Patent: Nov. 25, 2008

(54) SCALING OF SAMPLING POSITION IN SAMPLE RATE CONVERTER

(75) Inventor: Olivier Cousin, High Wycombe (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/688,999

(22) Filed: Mar. 21, 2007

(51) Int. Cl.
*H03M 7/00* (2006.01)

(52) U.S. Cl. .......................... 341/61; 341/60

(58) Field of Classification Search ............... 341/50–90
See application file for complete search history.

(56) References Cited

U.S. PATENT DOCUMENTS

| 5,608,394 | A | * | 3/1997 | Hirabayashi | 341/11 |
|---|---|---|---|---|---|
| 5,818,888 | A | * | 10/1998 | Holmqvist | 341/61 |
| 6,084,372 | A | * | 7/2000 | Saylor | 318/568.1 |
| 6,265,999 | B1 | * | 7/2001 | Prucnal | 341/137 |
| 6,600,495 | B1 | | 7/2003 | Boland et al. | |
| 6,636,165 | B2 | * | 10/2003 | Freidhof | 341/61 |
| 6,788,221 | B1 | * | 9/2004 | Ely et al. | 341/20 |
| 6,873,275 | B2 | * | 3/2005 | Komamura et al. | 341/143 |
| 6,980,134 | B2 | * | 12/2005 | Ely et al. | 341/20 |
| 7,298,296 | B1 | * | 11/2007 | Kamath | 341/61 |

\* cited by examiner

*Primary Examiner*—Lam T Mai
(74) *Attorney, Agent, or Firm*—Townsend and Townsend and Crew LLP

(57) ABSTRACT

An iterative method provides an output value at each iteration, indicating a time position of an output sample to be generated in a subsequent processing step, relative to the time position of a known input sample. The method also provides an indication as to whether a new input sample needs to be used to generate the output sample.

15 Claims, 2 Drawing Sheets

SCALING OF SAMPLING POSITION IN SAMPLE RATE CONVERTER

BACKGROUND OF THE INVENTION

This invention relates to a sample rate converter, and in particular to a method and apparatus for calculating time positions at which output sample values should be generated.

In many situations, signals, such as audio signals, are stored in the form of digital signals. That is, the continuously varying analog signal is sampled at predetermined times, and the values of the signal at these sampling times are stored in a digital form. The digital form of signal can then conveniently be stored on digital media such as optical or magnetic discs, and can conveniently be transmitted over digital channels such as those found in internet connections or in wireless communication networks.

An important feature of such a digital signal, and in particular a digital audio signal, is the sampling rate, or sampling frequency, that is, the number of samples that are taken in a fixed period of time. For example, digital audio signals stored on audio compact discs have a sampling frequency of 44.1 kHz. That is, 44,100 samples are taken in each second. Other digital audio formats have different sampling frequencies.

When a digital signal in one format is to be converted to a different format, it becomes necessary to perform a sample rate conversion.

In order to be able to perform a sample rate conversion from a first digital signal to a second digital signal, it is necessary firstly to determine the time positions, for which output sample values in the second digital signal should be calculated. These time positions, for the output sample values in the second digital signal, can be expressed relative to the time positions of the input sample values in the first digital signal. For example, in a simple case, where the sample rate is to be doubled, say from 24 kHz to 48 kHz, it is apparent that that the time positions for the output sample values in the second digital signal should most conveniently include all of the time positions of the input sample values in the first digital signal plus time positions exactly half way between the time positions of each pair of successive input sample values.

When the time positions have been determined, then the required output sample values can be calculated, using the input sample values in the first digital signal in an interpolation process, as required.

As mentioned above, there can be simple cases, where it is straightforward to generate the time positions, for which output sample values should be calculated. However, it is advantageous to be able to use a method that is applicable in all cases.

SUMMARY OF THE INVENTION

According to an aspect of the present invention, there is provided a method for generating time positions, for which output sample values should be calculated.

More specifically, for each intended output sample, an error value is formed, by successively adding to an initial value a sample rate conversion factor related to the ratio between the input sampling rate and the output sampling rate. The time position of the output sample can be determined from the results of this process.

In a subsequent stage, the time position of the output sample can be used to calculate the value of the output sample.

In a further aspect of the present invention, there is provided a sample rate conversion device, operating in accordance with the method for determining the time positions of the output samples.

In a further aspect of the present invention, there is provided computer-readable code, suitable for causing a programmable logic device to implement a sample rate conversion device in accordance with the invention.

DETAILED DESCRIPTION OF PREFERRED EMBODIMENTS

Figure 1:
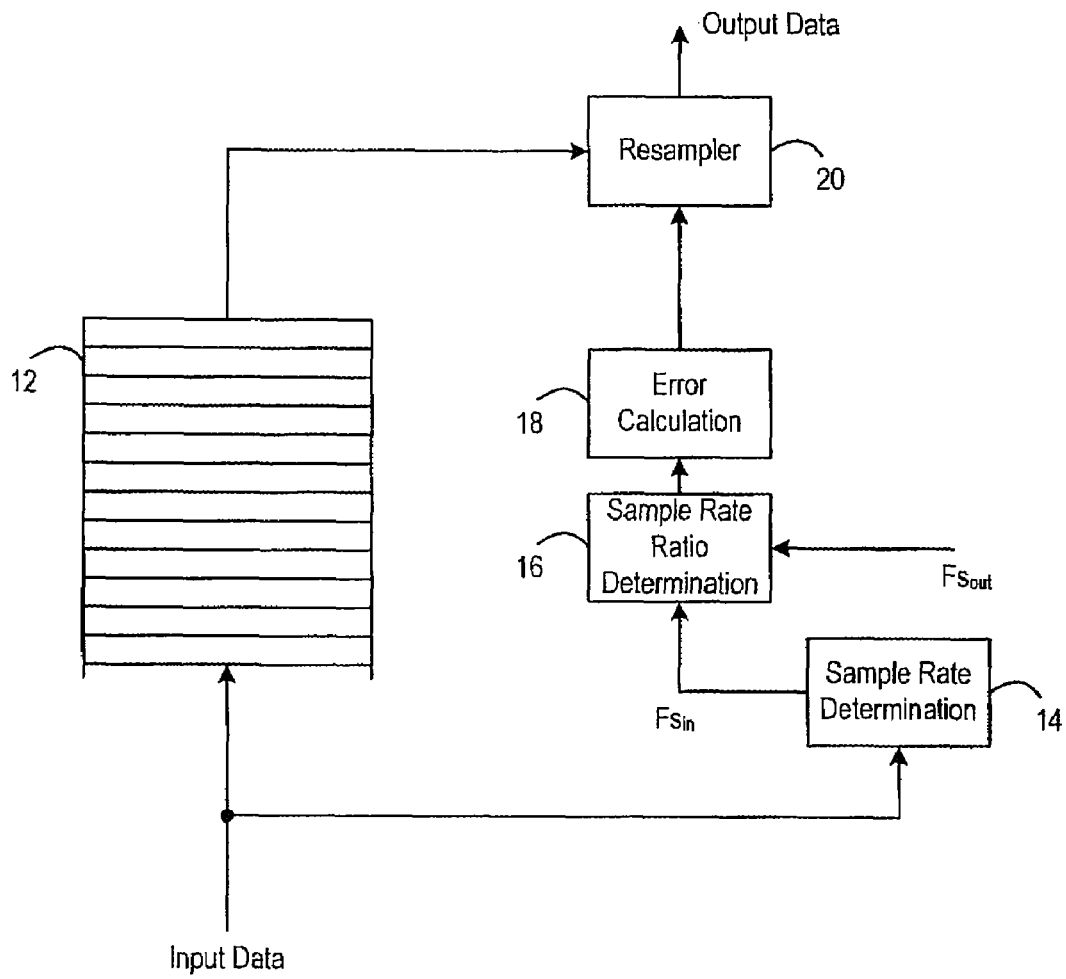
FIG. 1 is a block schematic diagram of a sample rate conversion device in accordance with an aspect of the invention.

FIG. 1 is a block schematic diagram, illustrating a sample rate conversion device 10. The sample rate conversion device 10 is intended for use in any application where input data is received at a first input sample rate, and is converted into data having a second output sample rate. The invention will be particularly described with reference to the case where the data is audio data. That is, each data sample is a digital representation of the magnitude of an analog audio signal at a particular instant in time. In this case, it is particularly important that sample rates be converted accurately, because changes in the sample rate cause changes in the pitch of the audio signal. However, the same techniques for sample rate conversion can be used irrespective of the content of the signals.

In the preferred embodiment, the sample rate conversion device 10 is implemented in a Field Programmable Gate Array, and is particularly suited for such an implementation. However, the device can be implemented in any convenient form. As is well known, a Field Programmable Gate Array device includes logic elements, that can be configured to perform a wide range of desired functions, depending on configuration data that is applied to the Field Programmable Gate Array device. In one embodiment, the invention relates to configuration data that can be applied to a Field Programmable Gate Array, in order to cause it to implement the sample rate conversion device 10 shown in FIG. 1.

As mentioned above, one possible application of the sample rate conversion device 10 is in an audio device, in which input audio data having a first sample rate must be converted into audio data having a second sample rate. For example, audio data stored on audio compact discs has a sample rate of 44.1 kHz, while audio data used in broadcast applications, for example, has a sample rate of 48.0 kHz.

As shown in FIG. 1, input data samples are applied successively to a register 12, in which they are stored on a First In-First Out basis.

In this illustrated embodiment of the invention, the input data samples are also applied to a sample rate determination circuit 14, which determines the sample rate of the input data samples. The operation of the sample rate determination circuit 14 will be known to the person skilled in the art, and will not be described further herein. Essentially, the rate at which samples are received is compared with a known frequency, for example obtained from an internal clock signal, in order to obtain a value for the sample rate of the input data samples.

The sample rate of the input data samples, $Fs_{in}$, obtained by the sample rate determination circuit 14, is then passed to a first input of a sample rate ratio determination block 16. An intended sample rate of the output data samples, $Fs_{out}$, is passed to a second input of the sample rate ratio determination block 16. The intended sample rate of the output data samples, $Fs_{out}$, can be obtained from any other part of the larger device, of which the sample rate conversion device 10 forms a part. The sample rate ratio determination block 16 determines a ratio, m, of the sample rate of the input data samples, $Fs_{in}$, to a sample rate of the output data samples, $Fs_{out}$. That is:

$$m = \frac{Fs_{in}}{Fs_{out}}$$

Thus, as described above, the sample rate of the input data samples, $Fs_{in}$, is determined from the samples themselves. This can for example be the case when the input data has been transmitted over a serial data link. In other embodiments of the invention, the sample rate of the input data samples, $Fs_{in}$, can be provided as a fixed or variable input to the sample rate conversion device 10. This can for example be the case when the input data is read from a previously stored file.

In this illustrated embodiment, the intended sample rate of the output data samples, $Fs_{out}$, is provided as a variable input to the sample rate conversion device 10. In other embodiments of the invention, the intended sample rate of the output data samples, $Fs_{out}$, can be fixed. Where the input and output sample rates are both fixed, the sample rate ratio, m, can be provided as a fixed value.

The sample rate ratio, m, is provided to an error calculation block 18, which performs an algorithm to determine a time position of each required output sample, compared to the time positions of the input samples. As will be described in more detail below, in the illustrated embodiment, the algorithm does this by determining an error value.

The error value, determined by the error calculation block 18, is passed to a resampler 20. The resampler 20 is able to access the input data sample values, stored in the register 12, and generates the output data sample values based on these input data sample values, and on the error values determined by the error calculation block 18. For example, each output sample may be formed by linear interpolation between two of the input sample values. The outputs from the error calculation block 18 can then be used to determine the two input sample values that are to be used, and their relevant weightings when forming the output sample value.

Figure 2:
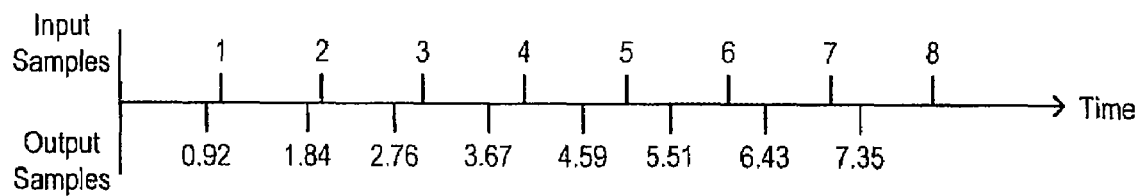
FIG. 2 illustrates the times at which output samples require to be generated, in a particular case, based on specific input signals.

FIG. 2 is a schematic diagram, illustrating a typical case, and indicating the time positions at which input samples are received, and at which output samples are required. Thus, FIG. 1 illustrates the case where input data is received with a sample rate of 44.1 kHz, and the output data is required to have a sample rate of 48 kHz. In this case, the sample rate ratio, m, can be calculated as 44.1/48=0.91875.

Thus, if input samples are received at times, T=0, 1, 2, 3, 4, 5, 6, 7, 8, . . . , and a first output sample is generated at time T=0, subsequent output samples are required at times T=0.92, 1.84, 2.76, 3.67, 4.59, 5.51, 6.43, 7.35, . . . , as shown in FIG. 2.

In this case, if linear interpolation is to be used to calculate the output samples, it can be seen that it is necessary to know which input sample value immediately precedes the required output sample, and which input sample value immediately follows the required output sample. Moreover, if the first approximation to the linearly interpolated output sample is the mean of these two input samples, it is also necessary to know the time interval between the time position of the required output sample and the midpoint between the time positions of these two input samples.

Thus, if the input sample immediately preceding the required output sample has a sample value $S_a$, and the input sample immediately following the required output sample has a value $S_{a+1}$, the mean of these two input sample values is $(S_a+S_{a+1})/2$, and the difference between them is $(S_{a+1}-S_a)$. If the time interval between the time position of the required output sample and the midpoint between the time positions of these two input samples is a fraction $\epsilon$ of the time interval between the time positions of the two input samples, then the linearly interpolated output sample value $S_{out}$ is given by:

$$S_{out} = \frac{S_a + S_{a+1}}{2} + \varepsilon(S_{a+1} - S_a).$$

The algorithm carried out in the error calculation block 18 of FIG. 1 indicates the two input samples that are to be used for this interpolation, and the error value also indicates the required time interval described above.

In another embodiment of the invention, the output sample value can be generated by means of a Farrow filter, operating on the relevant input samples.

Figure 3:
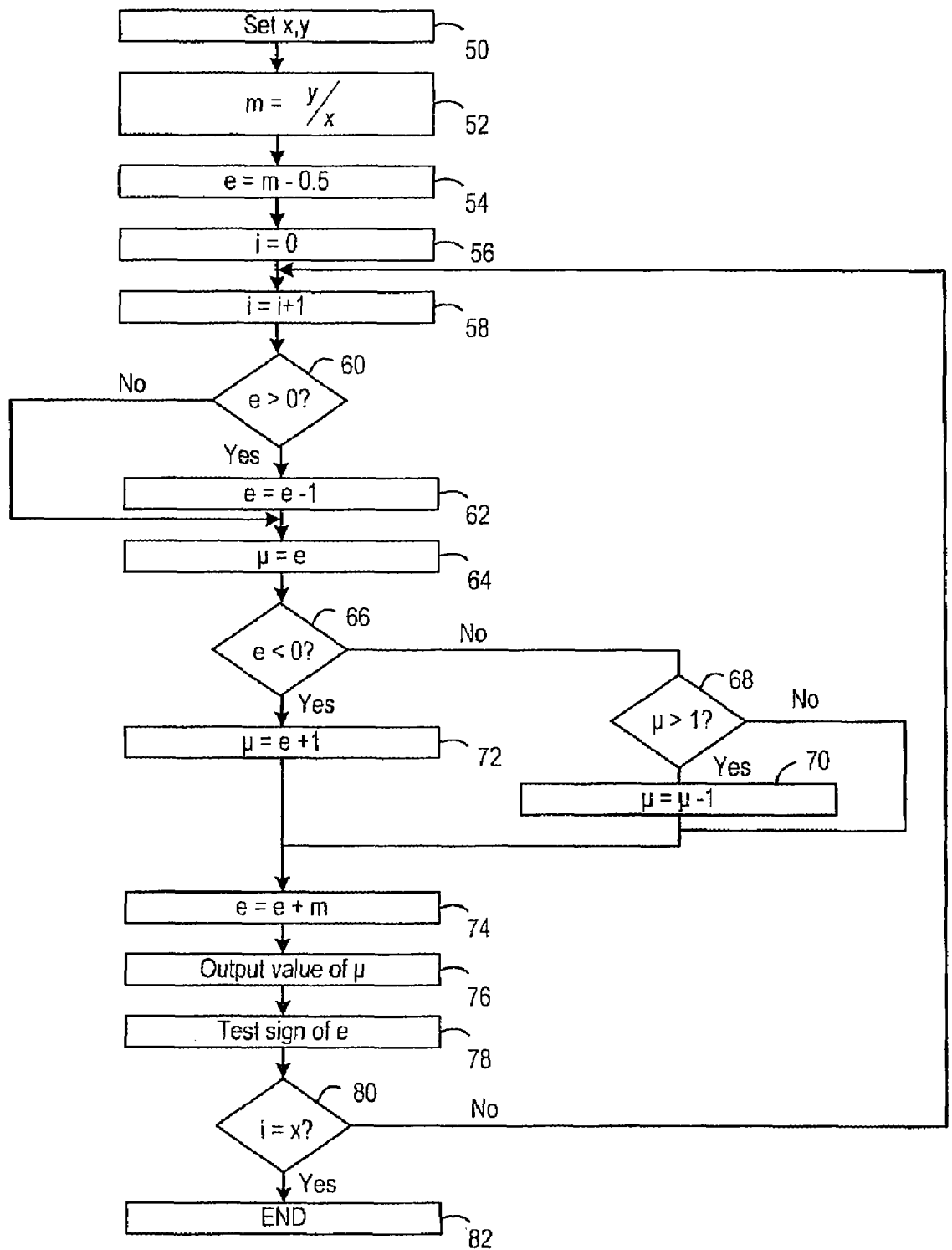
FIG. 3 is a flow chart, illustrating a method in accordance with an aspect of the invention.

FIG. 3 is a flow chart, illustrating the algorithm carried out in the error calculation block 18 in an embodiment of the invention where the output sample is to be generated by a Farrow filter. The form of the filter will depend on the sampling rate, and requires a filter coefficient that can be used to process the input samples to generate the required output samples. Thus, in this embodiment of the invention, the algorithm generates the error value, which can then be used to generate this coefficient. Also, the algorithm automatically generates a signal to indicate when a new input sample is required to be input.

It will be appreciated that different algorithms can be used, in which the output value can be regarded as the distance of the next output sample from the most recent input sample, or as the distance of the next output sample from the midpoint of the two most recent input sample, to take just two examples. Similarly, while the algorithm can generate a signal to indicate that a new input sample is required to be input, equivalently the default position can instead be that a new input sample is input, and the algorithm can then generate a signal to indicate that a new input should not be input.

In the flow chart of FIG. 3, the process starts at step 50, in which input values x and y are set. The values for x and y are set such that x and y are the lowest possible integer values, while x and y are proportional to the output sampling rate and the input sampling rate, respectively. Thus, in the example discussed above, where input data is received with a sample rate of 44.1 kHz, and the output data is required to have a sample rate of 48 kHz, x is set to be 480, while y is set to be 441. Thus, there are 480 output samples generated for every 441 input samples.

In step 52, the sample rate ratio, m, is formed as the ratio of x and y. Thus, m=y/x.

In step 54, a parameter value, e is initialized by setting e=m−0.5.

In step 56, a counter, i is initialized to zero, and then, in step 58, the value of i is incremented by one.

In step 60, it is determined whether the current value of e is positive. If so, then e is decremented by one in step 62, and the process passes to step 64, but otherwise the process passes directly to step 64.

In step 64, an error value, U, is set equal to the parameter value, e.

In step 66, it is determined whether the current value of e is negative. If not, the process passes to step 68, in which it is determined whether the error value, µ, is greater than one. If not, the process passes to step 74 but, if the error value, µ, is greater than one, then it is decremented by one in step 70, and then the process passes to step 74. If it is determined in step 66 that the current value of e is negative, the process passes to step 72, in which the error value, µ, is set to be greater by one than the parameter value, e, i.e. µ=e+1, and then the process passes to step 74.

In step 74, the current value of the parameter value, e, is increased by the sample rate ratio, m, i.e. e=e+m, to form the parameter value, e, to be used in the next iteration.

In step 76, the current value of the error value, µ, is read and, in step 78, the sign (i.e. positive or negative) of the parameter value, e, is tested.

In step 80, it is tested whether the value of the counter, i, has reached the value of x. If so, this indicates that a complete cycle has been completed, and the process passes to step 82, where it ends. If it is determined in step 80 that the value of the counter, i, has not reached the value of x, the process returns to step 58 for a further iteration.

The algorithm illustrated in FIG. 3 thus generates two outputs, namely the current value of the error, µ, and, the sign (i.e. positive or negative) of the parameter value, e.

In this illustrated embodiment of the invention, the value of the error, µ, can be used as an input to a further processing stage, for example in the resampler 20, where a filter can be implemented, with each value of the filter coefficient being determined by the current value of the error, µ. Thus, the error value, µ, represents the time position of the required output sample, relative to the current input sample.

Also, the sign of the parameter value, e, can be used to indicate whether a new input sample is required. Specifically, in this illustrated embodiment, a new sample value is used when the value of the parameter, e, is positive.

It will thus be appreciated that the data can be processed in a simple manner, without requiring any division operations, or any other computationally expensive operations, thereby making the processing particularly suitable for implementation in a Field Programmable Gate Array or other programmable logic device. It will also be noted that the device is suitable for use with any ratio of input sample rate to output sample rate, with adjustment of one or two parameter values.

There are therefore described a sample rate conversion method and a sample rate conversion circuit that can be used to provide a sample rate converted output, without requiring large amounts of processing resources.

The invention claimed is:

1. A method of calculating time positions at which output sample values should be generated, relative to time positions of input samples, when transforming an input digital signal having a first sampling rate to an output digital signal having a second sampling rate, the method comprising, for each of a plurality of output samples:
  adding to a current parameter value a sample rate conversion factor related to the ratio between the input sampling rate and the output sampling rate to form a new error value;
  determining based on the current parameter value whether a new input sample value should be selected and, if so, selecting the new input sample value; and
  calculating a time position based on a most recently selected input sample value and a current parameter value.

2. A method as claimed in claim 1, wherein the step of determining based on the current parameter value whether a new input sample value should be selected comprises determining whether the new input sample value should be selected based on a sign of the current parameter value.

3. A method as claimed in claim 1, further comprising:
  forming from said current parameter value an error value, such that said error value lies within the range from 0 to 1, wherein said error value represents said time position at which a current output sample value should be generated, relative to the time position of a most recently selected input sample.

4. A method as claimed in claim 1, comprising determining said first sampling rate from said input digital signal.

5. A method as claimed in claim 4, comprising determining said sample rate conversion factor from said determined first sampling rate and an input value for the output sampling rate.

6. A method as claimed in claim 1, further comprising:
  setting first and second integer values, proportional to said first sampling rate of said input digital signal and to said second sampling rate of said output digital signal respectively;
  forming said sample rate conversion factor as a ratio of said first and second integer values; and
  performing said method to obtain a number of time positions equal to said second integer value.

7. A sample rate conversion device, comprising a time position calculation device, wherein said time position calculation device calculates time positions at which output sample values should be generated, relative to time positions of input samples, in order to transform an input digital signal having a first sampling rate to an output digital signal having a second sampling rate, the time position calculation device implemented using a Field Programmable Gate Array, the time position calculation device comprising a plurality of logic elements configured to: output
  add to a current parameter value a sample rate conversion factor related to the ratio between the input sampling rate and the output sampling rate to form a new error value;
  determine based on the current parameter value whether a new input sample value should be selected and, if so, selecting the new input sample value; and
  calculate a time position based on a most recently selected input sample value and a current parameter value.

8. A sample rate conversion device as claimed in claim 7, wherein the logic elements configured to determine based on the current parameter value whether a new input sample value should be selected comprises logic elements configured to determine whether the new input sample value should be selected based on a sign of the current parameter value.

9. A sample rate conversion device as claimed in claim 7, wherein said sample rate conversion device forms from said current parameter value an error value, such that said error value lies within the range from 0 to 1, wherein said error value represents said time position at which a current output sample value should be generated, relative to the time position of a most recently selected input sample.

10. A sample rate conversion device as claimed in claim 7, wherein said sample rate conversion device determines said first sampling rate from said input digital signal.

11. A sample rate conversion device as claimed in claim 10, wherein said sample rate conversion device determines said sample rate conversion factor from said determined first sampling rate and an input value for the output sampling rate.

12. A sample rate conversion device as claimed in claim 7, wherein said sample rate conversion device:
   sets first and second integer values, proportional to said first sampling rate of said input digital signal and to said second sampling rate of said output digital signal respectively;
   forms said sample rate conversion factor as a ratio of said first and second integer values; and
   performs said method to obtain a number of time positions equal to said second integer value.

13. A sample rate conversion device as claimed in claim 7, further comprising a register, for storing input samples on a first-in, first-out basis.

14. Computer-readable code stored on a computer-readable hardware device, the computer readable code suitable for causing a programmable logic device to implement a sample rate conversion device comprising a time position calculation device, wherein said time position calculation device calculates time positions at which output sample values should be generated, relative to time positions of input samples, in order to transform an input digital signal having a first sampling rate to an output digital signal having a second sampling rate, the computer readable code comprising:
   code for causing the time position calculation device to add to a current parameter value a sample rate conversion factor related to the ratio between the input sampling rate and the output sampling rate to form a new error value;
   code for causing the time position calculation device to determine based on the current parameter value whether a new input sample value should be selected and, if so, selecting the new input sample value; and
   code for causing the time position calculation device to calculate a time position based on a most recently selected input sample value and a current parameter value.

15. A Field Programmable Gate Array, configured to provide a sample rate conversion device comprising a time position calculation device, wherein said time position calculation device calculates time positions at which output sample values should be generated, relative to time positions of input samples, in order to transform an input digital signal having a first sampling rate to an output digital signal having a second sampling rate, the time position calculation device comprising a plurality of logic elements configured to:
   add to a current parameter value a sample rate conversion factor related to the ratio between the input sampling rate and the output sampling rate to form a new error value;
   determine based on the current parameter value whether a new input sample value should be selected and, if so, selecting the new input sample value; and
   calculate a time position based on a most recently selected input sample value and a current parameter value.

* * * * *